United States Patent
Sun et al.

(10) Patent No.: US 8,732,519 B2
(45) Date of Patent: May 20, 2014

(54) METHOD FOR USING BAD BLOCKS OF FLASH MEMORY

(75) Inventors: Yingtong Sun, Shenzhen (CN); Junhong Weng, Shenzhen (CN)

(73) Assignee: Nationz Technologies Inc., Shenzhen (CN)

( * ) Notice: Subject to any disclaimer, the term of this patent is extended or adjusted under 35 U.S.C. 154(b) by 247 days.

(21) Appl. No.: 13/269,636

(22) Filed: Oct. 10, 2011

(65) Prior Publication Data

US 2012/0060054 A1    Mar. 8, 2012

Related U.S. Application Data

(63) Continuation of application No. PCT/CN2009/074566, filed on Oct. 22, 2009.

(30) Foreign Application Priority Data

Apr. 10, 2009 (CN) .......................... 2009 1 0106561

(51) Int. Cl.
    *G06F 11/00* (2006.01)
(52) U.S. Cl.
    USPC ........................................ 714/6.13
(58) Field of Classification Search
    USPC ........................................ 714/6.13
    See application file for complete search history.

(56) References Cited

U.S. PATENT DOCUMENTS

| | | | |
|---|---|---|---|
| 7,412,575 B2 * | 8/2008 | Park et al. ............... | 711/159 |
| 7,796,451 B2 * | 9/2010 | Norman .................. | 365/200 |
| 7,903,485 B2 * | 3/2011 | Norman .................. | 365/200 |
| 8,156,392 B2 * | 4/2012 | Flynn et al. ............. | 714/723 |
| 8,270,238 B2 * | 9/2012 | Norman .................. | 365/200 |
| 8,363,443 B2 * | 1/2013 | Chevallier et al. ...... | 365/51 |
| 8,370,680 B2 * | 2/2013 | Lee et al. ................ | 714/6.13 |
| 8,400,814 B2 * | 3/2013 | Tokiwa .................. | 365/148 |
| 8,427,868 B2 * | 4/2013 | Chevallier et al. ...... | 365/185.03 |
| 8,489,946 B2 * | 7/2013 | Galbraith et al. ....... | 714/723 |
| 2008/0162786 A1 * | 7/2008 | Shanmuganathan ..... | 711/103 |
| 2009/0055680 A1 * | 2/2009 | Honda et al. ............ | 714/5 |
| 2009/0070651 A1 * | 3/2009 | Diggs et al. ............. | 714/752 |
| 2009/0282301 A1 * | 11/2009 | Flynn et al. ............. | 714/710 |
| 2011/0007589 A1 * | 1/2011 | Norman .................. | 365/200 |
| 2011/0161727 A1 * | 6/2011 | Lee et al. ................ | 714/6.12 |
| 2011/0164450 A1 * | 7/2011 | Norman .................. | 365/185.09 |

* cited by examiner

*Primary Examiner* — Kamini Patel
(74) *Attorney, Agent, or Firm* — Anova Law Group, PLLC

(57) ABSTRACT

A method is provided for using bad blocks in flash memory. The method includes placing in a replacement area of the flash memory a special bad block that meets a "still usable" condition from the bad blocks of the flash memory. The method also includes receiving a use request for using the special bad block in the replacement area to store user data, writing the user data into the special bad block, and determining whether the user data is successfully written into the special bad block. Further, the method includes placing the special bad block back into the replacement area for a next use request when it is determined that the user data is not successfully written into the special bad block.

16 Claims, 3 Drawing Sheets

METHOD FOR USING BAD BLOCKS OF FLASH MEMORY

CROSS-REFERENCES TO RELATED APPLICATIONS

This application claims the priority of PCT patent application no. PCT/CN2009/074566, filed on Oct. 22, 2009, which claims the priority of Chinese patent application no. 200910106561.9, filed on Apr. 10, 2009, the entire contents of all of which are incorporated herein by reference.

FIELD OF THE INVENTION

The present invention relates to the field of memory technologies and, more particularly, to methods and systems for using bad blocks of flash memory.

BACKGROUND

Flash memory is a non-volatile semiconductor memory chip with certain advantages such as small volume, low power consumption, and less susceptibility to physical damages, and is an ideal storage medium for mobile digital products.

According to internal architectures and implementation techniques, flash memory can be separated into several types, such as AND, NAND, NOR and DiNOR. Currently, the NAND-type flash memory remains as the mainstream. NAND technology is often advantageous because of its high write-back speed, small chip area, and large storage capacities. With the NAND technology, the basic storage unit of a flash memory chip is called a page, typically containing 512, 2048, 4096, or 8192 bytes. A number of pages form a block, and the size of the block equals to the product of the size of the page and the total number of pages in the block.

Blocks in different flash memory chips may have different number of pages, usually ranging from 16 to 128 pages. Data are written to the flash memory using the page as a unit, but the pages must be erased before being written. The erasing is performed using the block as a unit, as the flash memory consists of serially-arranged blocks. In fact, NAND-type flash memory is a sequentially-readable device, and it only takes an 8-bit I/O port to access the data using the page as the unit.

Reading and erasing files in NAND flash memory, especially continuous large-volume files, is very fast. However, the random access speed is lower, because the flash memory cannot be written in byte. Further, it is easy for the NAND flash memory to develop bad blocks. A bad block appears when certain bit(s) of certain byte(s) in a page cannot be programmed, usually a '1' not being able to be programmed to a '0'. In order to ensure the security of data during flash memory access, and to avoid accessing bad blocks, a controller is added, usually during the design, to manage any bad blocks. When there is data access to a bad block, the controller transfers the data access to a predetermined spare storage space. Thus, the bad blocks are not used and the data security and integrity is ensured.

Flash memory manufactured using existing technologies generally went through a mass production process, where, through certain means, bad blocks in the flash memory are identified and marked. At the same time, a certain number of good blocks are set aside as spare blocks or replacement blocks. When bad blocks appear during later use processes, these spare blocks can be used to replace the bad blocks. FIG. 3 shows a flow diagram for a bad block scanning and marking process during the mass production using the existing technologies.

Chinese patent application no. CN10139462A discloses "a method and apparatus for dynamically compensating defective flash memory," which reserves a group of good blocks from the flash memory as replacement blocks. Through testing, if any bad block is found, a good block from the group is used to replace the bad block, while the bad block is placed at the end of the group of good blocks. Thus, such approach protects the data security by reserving good blocks in the flash memory as the replacement blocks.

Because NAND flash memory is prone to developing bad blocks, when the memory capacity increases, the number of bad blocks in the flash memory can also increase. Only setting aside certain good blocks can leave those bad blocks that are sensitive only to certain data unused and, thus, decrease the capacity of the entire flash memory. Thus, it appears that existing technologies do not use flash memory bad blocks, and these flash memory bad blocks may include those being sensitive only to certain data, which means that not all bad blocks in the flash memory are unusable. If those flash memory bad blocks are left unused, as the capacity of the flash memory keeps increasing, more and more memory space will be wasted. FIG. 4 shows a flow diagram for processing bad blocks using the existing technologies.

The disclosed methods and systems are directed to solve one or more problems set forth above and other problems.

BRIEF SUMMARY OF THE DISCLOSURE

One aspect of the present disclosure includes a method for using bad blocks in flash memory. The method includes placing in a replacement area of the flash memory a special bad block that meets a "still usable" condition from the bad blocks of the flash memory. The method also includes receiving a use request for using the special bad block in the replacement area to store user data, writing the user data into the special bad block, and determining whether the user data is successfully written into the special bad block. Further, the method includes placing the special bad block back into the replacement area for a next use request when it is determined that the user data is not successfully written into the special bad block.

Another aspect of the present disclosure includes a method for using bad blocks in flash memory. The method includes using a production software tool to scan the flash memory to discover the bad blocks and to record the bad blocks in a controller of the flash memory, and scanning the bad blocks discovered based on a pre-determined "still usable" condition to find a bad block that meets the "still usable" condition. The method also includes marking the bad block that meets the "still usable" condition as a special bad block, recording the special bad block in the controller, and marking bad blocks that do not meet the "still usable" condition as true bad blocks not to be used. Further, the method includes recording the true bad blocks in the controller and placing the special bad block in a replacement area of the flash memory together with certain good blocks of the flash memory.

Another aspect of the present disclosure includes a computer storage medium containing computer programs. When being executed by a processor, the computer programs perform a method for using bad blocks in flash memory. The method includes placing in a replacement area of the flash memory a special bad block that meets a "still usable" condition from the bad blocks of the flash memory. The method also includes receiving a use request for using the special bad block in the replacement area to store user data, writing the user data into the special bad block, and determining whether the user data is successfully written into the special bad block. Further, the method includes placing the special bad block back into the replacement area for a next use request when it is determined that the user data is not successfully written into the special bad block.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figures 1, 3:
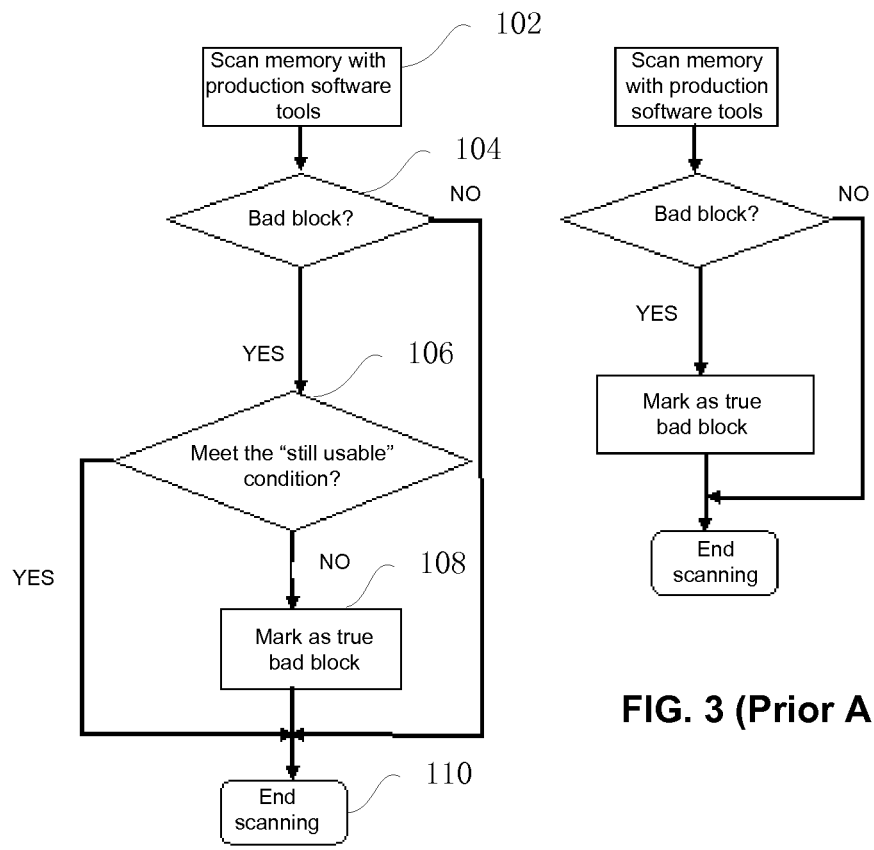
FIG. 1 illustrates a flowchart of an exemplary scanning process during mass production consistent with the disclosed embodiments.
FIG. 3 illustrates a flowchart of a scanning process during mass production with existing technologies.

FIG. 1 illustrates a flowchart of an exemplary bad block scanning process during mass production of flash memory. Although this disclosure only uses flash memory as an example, other types of memory may be also applicable. The term flash memory, as used herein, may refer to any appropriate type of non-volatile storage chip that can be electrically erased and reprogrammed. During manufacturing processes, shipping and handling processes, and use processes, the flash memory may develop bad blocks.

In general, during mass production or manufacturing process, bad blocks need to be discovered first. As shown in FIG. 1, a flash memory device in the production process is scanned using a production software tool (102). The production software tool may include any appropriate type of software used during the production process to detect and process the bad blocks in flash memory. The bad blocks in the flash memory can then be discovered and recorded in a controller within the flash memory or other appropriate locations.

More particularly, the production software tool may perform certain tests on a block of the flash memory when scanning the flash memory to determine whether the scanned block is a bad block (104). For example, a block exceeds the flash memory controller ECC (error correction code) range may be determined as a bad block.

If the scanned block is not a bad block (104; NO), the scanning process for this block may be completed (110). On the other hand, if the scanned block is a bad block (104; YES), the bad block found by the production software tool are scanned again according to a pre-determined selection condition called a "still usable" condition to determine whether the bad block meets the "still usable" condition (106). That is, the bad block found by the production software tool is again scanned by other software that is different from the production software tool to determine whether the bad block is a "still usable" bad block.

The "still usable" condition may be set based on any appropriate criteria and tested accordingly. For example, for a NAND flash device, the device's specification may require an 8-bit ECC error correction algorithm for each block. Thus, if a 10-bit error occurs, the block might be considered as a bad block when the block is scanned or otherwise tested. However, in certain embodiments, more than 8 bits of ECC error correction algorithms, such as 12 bits, may also be used for detecting a "still usable" bad block. When a 12-bit ECC error correction algorithm is used, the 10-bit error may be considered as a non-error, and thus the bad block may be considered as a "still usable" bad block. However, if a 14-bit error occurs in the block, the block may be considered as a true bad block. That is, the 14-bit error is over both the range of the device's specification and the range of a "still usable" block. Other number of bits or other criteria may also be used for those bad blocks that can be used later. The bad blocks meeting the "still usable" condition may be called "special data-sensitive bad blocks." The term "special data-sensitive bad blocks" may refer to those bad blocks that fail to be successfully programmed with certain data, but can be successfully programmed with certain other data.

Thus, during the scanning process, if a bad block meets the "still usable" condition (106; YES), the bad block is marked as the "special data-sensitive bad block." On the other hand, if a bad block does not satisfy the "still usable" condition (106; NO), the bad block is marked as a true bad block (108). This scanning and marking process repeats until all bad blocks discovered are marked and recorded, and then the process may be completed (110). Further, both special data-sensitive bad blocks and true bad blocks are recorded in the controller of the flash memory. The scanning and marking process is mainly for scanning and finding the "still usable" "special data sensitive bad blocks." Because such "special data-sensitive bad blocks" may only fail to be programmed with certain data, while being successful with other data, these "special data-sensitive bad blocks" are not entirely unusable.

Figures 2, 4:
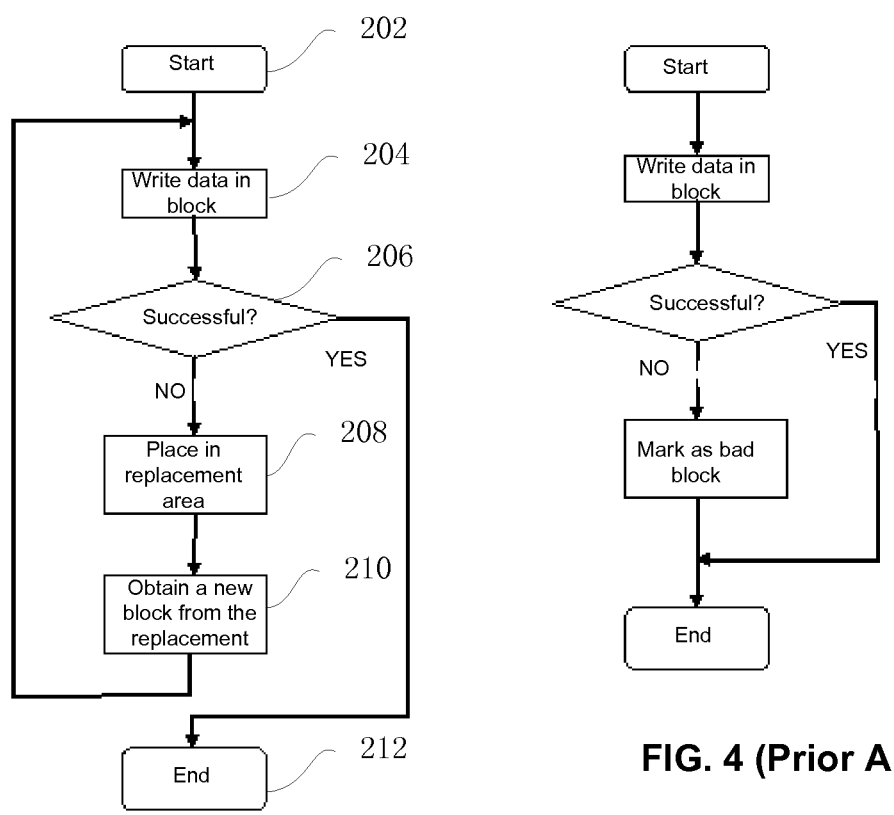
FIG. 2 illustrates a flowchart of an exemplary flash memory bad block use method consistent with the disclosed embodiments.
FIG. 4 illustrates a flowchart of a flash memory bad block use method with existing technologies.

After these "special data-sensitive bad blocks" are scanned and marked, these "special data-sensitive bad blocks" may then be used. More particularly, when using the flash memory, these "special data-sensitive bad blocks" are placed in a replacement area of the flash memory to be used together with good blocks, instead of leaving these special bad blocks unused. Optionally, the "special data-sensitive bad block" detection and marking can also be used in the use process to detect and mark any "special data-sensitive bad block" developed from a good block in the flash memory. FIG. 2 shows an exemplary process for using these "special data sensitive bad blocks."

As shown in FIG. 2, at the beginning, the flash memory may be initialized and the use process may be started (202). The flash memory may have a replacement area for bad block management, which may include a certain number of good blocks. However, because the "special data-sensitive bad blocks" are recorded in the flash memory controller, the flash memory may also place the "special data-sensitive bad blocks" into the replacement area to be used together with the good blocks as replacement blocks after the "special data-sensitive bad blocks" are scanned and marked during the production process or when the flash memory is initialized.

When the flash memory (e.g., flash memory controller and certain flash memory control software or firmware, etc.) receives a use request to use a "special data-sensitive bad block" in the replacement area, the flash memory firmware may attempt to write data in the "special data-sensitive bad block" (204). For example, the firmware may erase the data in the "special data-sensitive bad block" if it has not been erased, and may program the data according to a certain protocol to write the data into the "special data-sensitive bad block."

Further, the flash memory may determine whether the writing operation is successful (206). The flash memory may determine whether the writing operation is successful based on any appropriate criteria, such as return status, checksum, or ECC (error correction code) status, etc. If the data is written into the "special data-sensitive bad block" successfully (206; YES), i.e., the "special data-sensitive bad block" can accept the data written, and the writing operation was successful, the use process may be completed (212).

On the other hand, if the data is not successfully written into the "special data-sensitive bad block" (206; NO), i.e., the "special data-sensitive bad block" cannot accept the data written and the writing operation failed, the "special data-sensitive bad block" is again placed back in the replacement area (208). The "special data-sensitive bad block" may then be used for the next writing operation with other data in a next use request. Further, a new block from the replacement area is obtained and used (210), and the process continues from 204.

Figure 5:
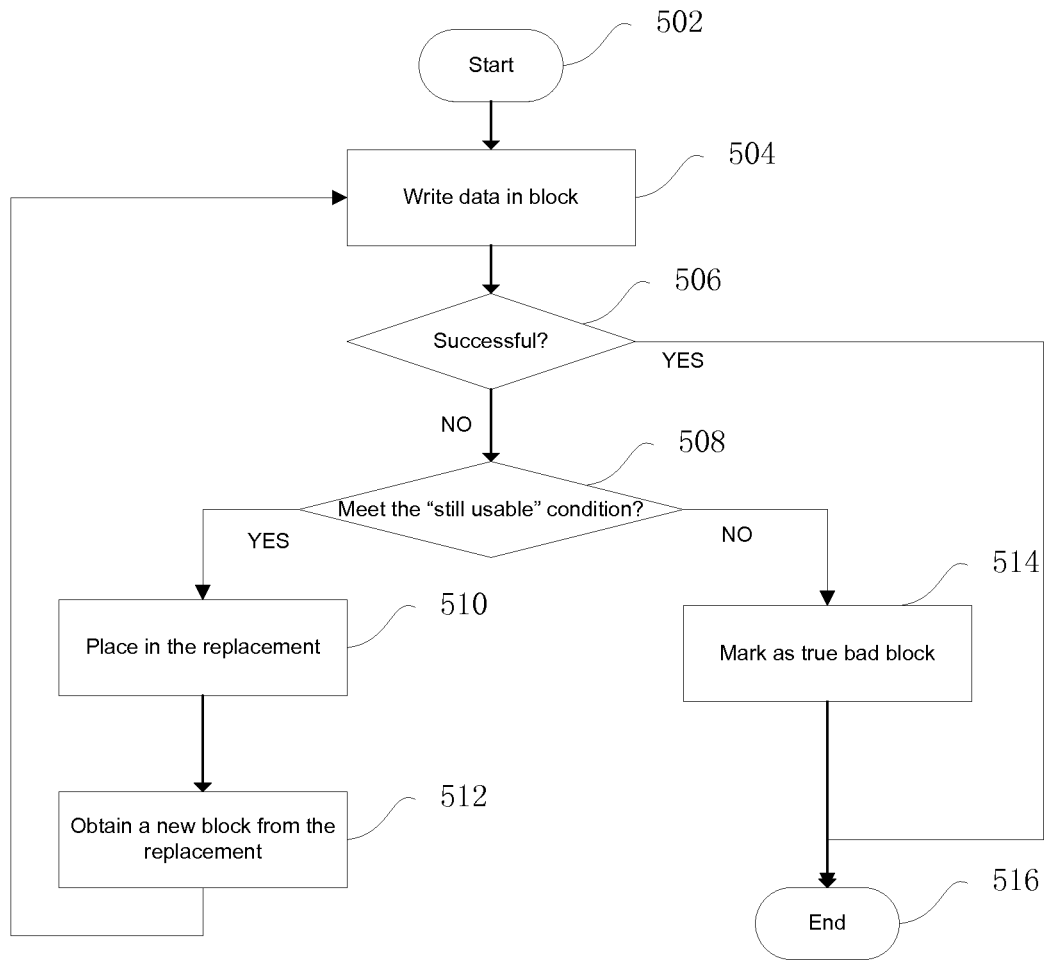
FIG. 5 illustrates a flowchart of another exemplary flash memory bad block use method consistent with the disclosed embodiments.

FIG. 5 shows another exemplary process for using "special data sensitive bad blocks." As shown in FIG. 5, similarly to FIG. 2, at the beginning, the flash memory may be initialized and the use process may be started (502). When the flash memory receives a use request to use a "special data-sensitive bad block" in the replacement area, the flash memory firmware may attempt to write data in the "special data-sensitive bad block" (504), and the flash memory may then determine whether the writing operation is successful (506). If the data is written into the "special data-sensitive bad block" successfully (506; YES), i.e., the "special data-sensitive bad block" can accept the data written, and the writing operation was successful, the use process may be completed (516).

On the other hand, if the data is not successfully written into the "special data-sensitive bad block" (506; NO), i.e., the "special data-sensitive bad block" cannot accept the data written and the writing operation failed, the flash memory may further determine whether the bad block meets the "still usable" condition (508). If the "special data-sensitive bad block" does not meet the "still usable" condition (508; NO), the "special data-sensitive bad block" is marked as a true bad block (514). The "special data-sensitive bad block" marked as a true bad block is removed from or kept out of the replacement area and never used again. The use process may also be completed afterwards (516).

However, if the "special data-sensitive bad block" meets the "still usable" condition (508; YES), the "special data-sensitive bad block" is again placed back in the replacement area (510). The "special data-sensitive bad block" may then be used for the next writing operation with other data. Further, a new block from the replacement area is obtained and used (512), and the process continues from 504.

It is understood that the above mentioned processes and methods may be implemented in hardware, software, and a combination of hardware and software, including firmware and/or other flash memory control and application software programs running on a host computer, such as a server, a desktop computer, a laptop computer, a smart phone, or any other type of device with a processor and flash memory, etc. The software programs may be stored on a storage medium such as a hard disk, an optical disk, a floppy disk, a flash disk, or any type of memory, etc. During operation of the host computer, the software programs may be loaded into a run-time environment of the host computer and executed by the processor to implement the disclosed processes and methods. Other implementations and applications may also be used.

The disclosed systems and methods may be able to take full advantage of flash memory bad blocks. The existing technologies identify flash memory bad blocks based on the flash memory controller ECC error correction range. Such physical mechanism for correcting flash memory bad blocks may cause certain data-sensitive bad blocks to be identified as real bad blocks and recorded in the controller never to be used. The disclosed methods, unlike the bad block identifying mechanisms used by existing technologies, do not mark those bad blocks that exceed the flash memory controller ECC error correction range and fail to be programmed with certain data, but is able to be programmed with other data, as true bad blocks never to be used. Instead, such bad blocks are used as "still usable" flash memory blocks.

Further, by using the disclosed systems and methods, the available flash memory capacity can be expanded. While, with the existing technologies, data access to flash memory blocks is confirmed mainly based on information recorded in the flash memory controller. During the flash memory mass production process, a flash memory block exceeding the flash memory controller ECC error correction range is confirmed as a bad block and recorded in the controller. Therefore, in the process of using the flash memory, these marked bad blocks of the flash memory will never be used, even though these flash memory bad blocks only fail to be programmed with certain data but other data. The disclosed methods use production software tools during the mass production process to record those "data-sensitive bad blocks" in the controller for later use, instead of simply leaving these bad blocks unused. When the flash memory is used, these "data-sensitive bad blocks" in the flash memory can be placed in the replacement block area to be used as normal blocks or good blocks. Thus, the available memory capacity can be maximized.

Finally, the disclosed methods and processes may be combined or mixed to implement other application without departing from the principles of the disclosed embodiments. Other advantages and applications may be obvious to those skilled in the art.

What is claimed is:

1. A method for using bad blocks in flash memory, comprising:
   placing in a replacement area of the flash memory a special bad block that meets a "still usable" condition from the bad blocks of the flash memory;
   receiving a use request for using the special bad block in the replacement area to store user data;
   writing the user data into the special bad block;
   determining whether the user data is successfully written into the special bad block; and
   when it is determined that the user data is not successfully written into the special bad block, placing the special bad block back into the replacement area for a next use request.

2. The method according to claim 1, wherein:
   the bad blocks are flash memory blocks exceeding an error correction code (ECC) range of a controller of the flash memory.

3. The method according to claim 1, wherein:
   the special bad block is a bad block from the bad blocks of the flash memory that fails to be successfully programmed with certain data but is able to be successfully programmed with certain other data.

4. The method according to claim 3, wherein:
the special bad block is placed in the replacement area together with certain good blocks of the flash memory and recorded in a controller of the flash memory.

5. The method according to claim 3, wherein, when it is determined that the user data is not written successfully, and before placing the special bad block back into the replacement area, the method further includes:
determining whether the special bad block meets the "still usable" condition;
when it is determined that the special bad block does not meet the "still usable" condition, marking the special bad block as a true bad block not to be used again; and
when it is determined that the special bad block meets the "still usable" condition, continuing to place the special bad block back into the replacement area.

6. The method according to claim 1, wherein:
the bad blocks were first discovered using a production software tool.

7. A method for using bad blocks in flash memory, comprising:
using a production software tool to scan the flash memory to discover the bad blocks and to record the bad blocks in a controller of the flash memory;
scanning the bad blocks discovered based on a pre-determined "still usable" condition to find a bad block that meets the "still usable" condition;
marking the bad block that meets the "still usable" condition as a special bad block;
recording the special bad block in the controller;
marking bad blocks that do not meet the "still usable" condition as true bad blocks not to be used;
recording the true bad blocks in the controller; and
placing the special bad block in a replacement area of the flash memory together with certain good blocks of the flash memory.

8. The method according to claim 7, wherein:
wherein the bad blocks are flash memory blocks exceeding an ECC range of the controller.

9. The method according to claim 7, wherein:
the special bad block is a bad block from the bad blocks of the flash memory that fails to be successfully programmed with certain data but is able to be successfully programmed with certain other data.

10. The method according to claim 7, further including:
receiving a use request for using the special bad block in the replacement area to store user data;
writing the user data into the special bad block;
determining whether the user data is successfully written into the special bad block; and
when it is determined that the user data is not successfully written into the special bad block, placing the special bad block back into the replacement area for a next use request.

11. A non-transitory computer storage medium having computer-readable programs, when being executed by a processor, performing a method for using bad blocks in flash memory, the method comprising:
placing in a replacement area of the flash memory a special bad block that meets a "still usable" condition from the bad blocks of the flash memory;
receiving a use request for using the special bad block in the replacement area to store user data;
writing the user data into the special bad block;
determining whether the user data is successfully written into the special bad block; and
when it is determined that the user data is not successfully written into the special bad block, placing the special bad block back into the replacement area for a next use request.

12. The non-transitory computer-readable storage medium according to claim 11, wherein:
the bad blocks are flash memory blocks exceeding an ECC range of a controller of the flash memory.

13. The non-transitory computer-readable storage medium according to claim 11, wherein:
the special bad block is a bad block from the bad blocks of the flash memory that fails to be successfully programmed with certain data but is able to be successfully programmed with certain other data.

14. The non-transitory computer-readable storage medium according to claim 13, wherein:
the special bad block is placed in the replacement area together with certain good blocks of the flash memory and recorded in a controller of the flash memory.

15. The non-transitory computer-readable storage medium according to claim 13, wherein, when it is determined that the user data is not written successfully, and before placing the special bad block back into the replacement area, the method further includes:
determining whether the special bad block meets the "still usable" condition;
when it is determined that the special bad block does not meet the "still usable" condition, marking the special bad block as a true bad block not to be used again; and
when it is determined that the special bad block meets the "still usable" condition, continuing to place the special bad block back into the replacement area.

16. The non-transitory computer-readable storage medium according to claim 11, wherein:
the bad blocks were first discovered using a production software tool.

* * * * *